United States Patent
Huang

(10) Patent No.: US 7,718,994 B2
(45) Date of Patent: May 18, 2010

(54) ARRAY SUBSTRATES FOR USE IN LIQUID CRYSTAL DISPLAYS AND FABRICATION METHODS THEREOF

(75) Inventor: Chun-Ju Huang, Tao Yuan Shien (TW)

(73) Assignee: AU Optronics Corp., Hsinchu (TW)

( * ) Notice: Subject to any disclaimer, the term of this patent is extended or adjusted under 35 U.S.C. 154(b) by 198 days.

(21) Appl. No.: 11/765,528

(22) Filed: Jun. 20, 2007

(65) Prior Publication Data
US 2007/0264736 A1     Nov. 15, 2007

Related U.S. Application Data

(62) Division of application No. 11/068,146, filed on Feb. 28, 2005, now Pat. No. 7,241,648.

(30) Foreign Application Priority Data
Nov. 11, 2004    (TW) .............................. 93134428 A

(51) Int. Cl.
  H01L 31/00    (2006.01)
  G02F 1/1343   (2006.01)
(52) U.S. Cl. .............................. 257/22; 257/57; 257/77; 349/141
(58) Field of Classification Search .................... 257/22, 257/57, 77, 225; 349/141
See application file for complete search history.

(56) References Cited

U.S. PATENT DOCUMENTS

| | | | | |
|---|---|---|---|---|
| 6,018,166 A | * | 1/2000 | Lin et al. | 257/22 |
| 6,218,221 B1 | * | 4/2001 | Sah | 438/158 |
| 6,338,989 B1 | * | 1/2002 | Ahn et al. | 438/158 |
| 6,744,486 B2 | | 6/2004 | Kim et al. | |
| 2003/0133067 A1 | * | 7/2003 | Park et al. | 349/141 |
| 2006/0003485 A1 | * | 1/2006 | Hoffman et al. | 438/73 |

* cited by examiner

*Primary Examiner*—Howard Weiss
*Assistant Examiner*—Steven H Rao
(74) *Attorney, Agent, or Firm*—Thomas, Kayden, Horstemeyer & Risley

(57) ABSTRACT

Array substrates for use in TFT-LCDs and fabrication methods thereof. A transparent conductive layer, a first metal layer, a first insulating layer, a semiconductor layer, a second insulating layer and a sacrificial layer are sequentially formed on a substrate. With a first photomask, a photoresist layer with various thicknesses is formed on part of the sacrificial layer. Using the photoresist layer as an etching mask, a gate line having a gate, a channel layer on the gate, a gate pad at the end portion of the gate line, a pixel electrode and a source pad are defined. An insulating spacer is formed on the sidewalls of the gate and gate line. With a second photomask, a source line, source and drain are formed. The source pad connects the end portion of the source line. An array substrate is thus obtained with only two photomasks.

8 Claims, 15 Drawing Sheets

ARRAY SUBSTRATES FOR USE IN LIQUID CRYSTAL DISPLAYS AND FABRICATION METHODS THEREOF

CROSS-REFERENCE TO RELATED APPLICATION

This application is a division of pending U.S. patent application Ser. No. 11/068,146, filed Feb. 28, 2005 and entitled "ARRAY SUBSTRATES FOR USE IN LIQUID CRYSTAL DISPLAYS AND FABRICATION METHODS THEREOF," the contents of which are incorporated herein by reference.

BACKGROUND

The invention relates to thin film transistor liquid crystal displays (TFT-LCDs), and more particularly to array substrates for use in TFT-LCDs and fabrication methods thereof.

Generally, liquid crystal displays comprise a lower substrate, an upper substrate and a liquid crystal layer interposed therebetween. The upper substrate typically comprises a color filter and a common electrode. The lower substrate typically comprises a plurality of pixel areas defined by crossing gate lines and source lines (or data lines). Each pixel area comprises a thin film transistor serving as a switching element located near the intersection of the gate and source lines and a pixel electrode electrically connected to the thin film transistor. The thin film transistor comprises a gate, a source and a drain, wherein the gate is extended from the gate line and the source is extended from the source line. The drain is electrically connected to the pixel electrode via a contact hole. The LCD further comprises a pad portion. The pad portion comprises a plurality of gate pads and a plurality of source pads (or data pads). The gate pads serve to apply signal voltages to the gate lines and the source pads serve to apply data voltages to the source lines. The gate and source pads are preferably located in a non-display area.

In order to form the array substrate, i.e., the lower substrate, processes such as deposition, photolithography, etching and stripping are repeated several times. The conventional method of forming the array substrate typically requires 4-6 masks, increasing processing errors and resulting in high production cost.

U.S. Pat. No. 6,338,989 to Ahn et al., the entirety of which is hereby incorporated by reference, discloses a 4-mask method of manufacturing an array substrate. First and second masks form a gate line, a gate pad, a data line and a data pad. A third mask forms a source, a drain and a pixel electrode and exposes a channel area. A fourth mask patterns an insulating layer to cover the gate line and the gate pad and to form a gate pad contact hole.

U.S. Pat. No. 6,567,150 to Kim, the entirety of which is hereby incorporated by reference, discloses a 6-mask method of manufacturing an array substrate, preventing defects from occurring at end portions of lines, such as pads.

SUMMARY

Methods of forming array substrates for use in thin film transistor liquid crystal displays (TFT-LCDs) are provided. In an exemplary embodiment of forming an array substrate for use in a TFT-LCD, a transparent conductive layer, a first metal layer, a first insulating layer, a semiconductor layer, a second insulating layer and a sacrificial layer are sequentially formed on a substrate. A photoresist pattern comprising a first photoresist layer and a second photoresist layer is formed on part of the sacrificial layer, wherein the second photoresist layer is thicker than the first photoresist layer. Using the photoresist pattern as an etching mask, at least part of the sacrificial layer, the second insulating layer and the semiconductor layer are removed to form a first opening and a second opening. The first photoresist layer is removed. Using the second photoresist layer as an etching mask, part of the sacrificial layer is removed to form a remaining sacrificial layer narrower than the second photoresist layer. Using the second photoresist layer as an etching mask, part of the second insulating layer and the semiconductor layer are removed. Using the second photoresist layer as an etching mask, the first and second openings are etched through to expose the substrate. The second photoresist layer is removed. Using the remaining sacrificial layer as an etching mask, part of the second insulating layer and the first insulating layer are removed to expose a portion of the first metal layer. The remaining sacrificial layer and the exposed first metal layer are removed to define a gate line comprising a gate, a channel layer located directly above the gate, a gate pad located at the end portion of the gate line, a pixel electrode and a source pad, wherein the first opening is located in the gate line near the gate. An insulating spacer is formed on sidewalls of the gate and the gate line. A second metal layer is thoroughly formed overlying the substrate. The second metal layer is patterned to form a source line, a source and a drain, wherein the source line crosses the gate line, the end portion of the source line is electrically connected to the source pad, the source is extended from the source line and electrically connected to the channel layer and the drain is electrically connected to the channel layer and the pixel electrode.

Array substrates for use in TFT-LCDs are provided. In an exemplary embodiment of an array substrate for use in a TFT-LCD, a substrate comprises a gate line area with a gate region, a gate pad area connected to the end portion of the gate line area, a source line area crossing the gate line area, a source pad area connected to the end portion of the source line area, and a pixel area defined by the crossing gate and source lines. A transparent conductive layer is disposed overlying the substrate in the gate pad area, the gate line area, the gate region, the source pad area and the pixel area. A first metal layer is disposed overlying the transparent conductive layer in the gate line area and the gate region. A first insulating layer is disposed overlying the first metal layer. A semiconductor layer is disposed overlying the first insulating layer. An insulating spacer is disposed on at least both sidewalls of the first metal layer. A second insulating layer is disposed overlying part of the semiconductor layer. A second metal layer is formed above the substrate in the source line area, overlying part of the semiconductor layer in the gate region and part of the transparent conductive layer in the pixel area.

With a first photomask, a photoresist layer with various thicknesses is formed on part of the sacrificial layer. Using the photoresist layer as an etching mask, a gate line having a gate, a channel layer on the gate, a gate pad at the end portion of the gate line, a pixel electrode and a source pad are defined. An insulating spacer is formed on the sidewalls of the gate and gate line. With a second photomask, a source line, source and drain are formed. The source pad connects the end portion of the source line. The array substrate can thus be obtained with only two photomasks, decreasing consumption of photomasks and production cost.

DESCRIPTION OF THE DRAWINGS

The invention can be more fully understood by reading the subsequent detailed description in conjunction with the examples and references made to the accompanying drawings, wherein.

DETAILED DESCRIPTION

Figure 1:
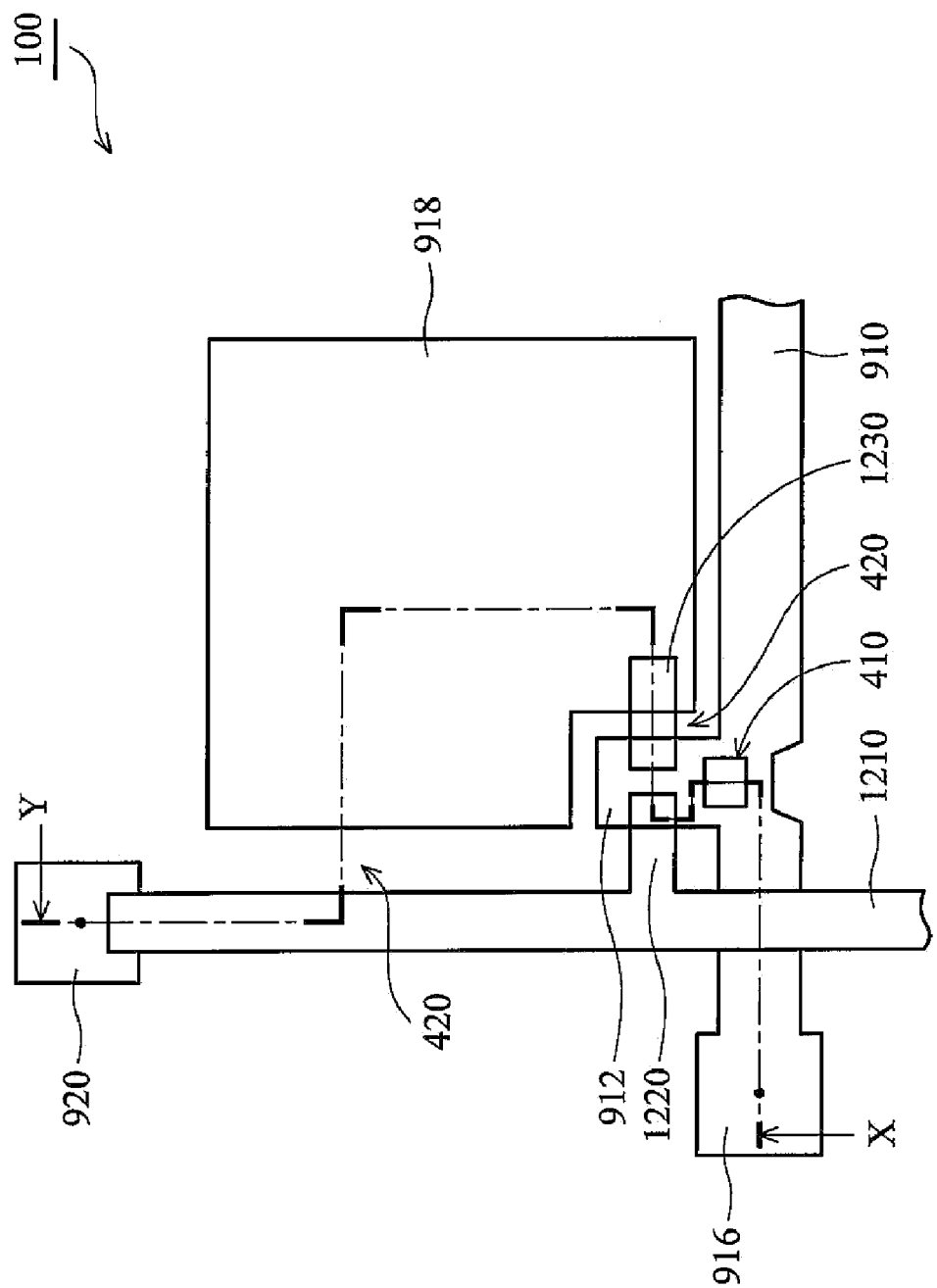
FIG. 1 is a partial plan view of an embodiment of an array substrate for use in a TFT-LCD.

Array substrates for use in thin film transistor liquid crystal displays (TFT-LCDs) and fabrication methods thereof are provided. FIG. 1 is a partial plan view of an exemplary embodiment of an array substrate 100 for use in a TFT-LCD. FIGS. 2-12 are schematic cross-sectional views taken along line X-Y of FIG. 1, illustrating an embodiment of a manufacturing process of the array substrate 100.

Figure 2:
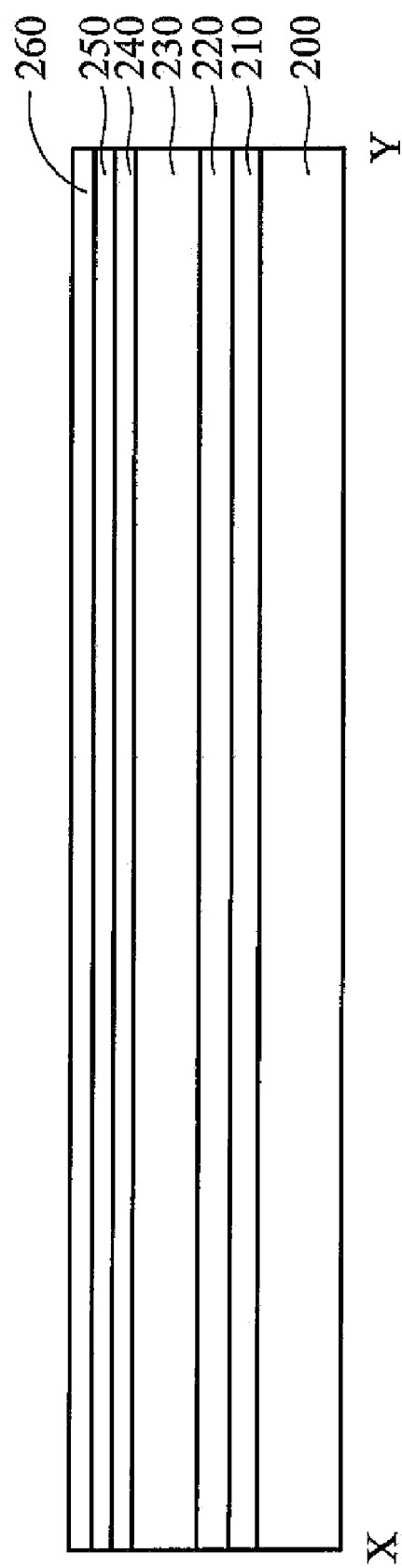
FIGS. 2-12 are cross-sectional views taken along line X-Y of FIG. 1, illustrating an embodiment of a manufacturing process of an embodiment of an array substrate.

In FIG. 2, a transparent conductive layer 210, a first metal layer 220, a first insulating layer 230, a semiconductor layer 240, a second insulating layer 250 and a sacrificial layer 260 are sequentially formed on an insulating substrate 200 by, for example, deposition. The insulating substrate 200 can be glass or quartz. The transparent conductive layer 210 can be indium-tin-oxide (ITO) or indium-zinc-oxide (IZO). The first metal layer 220 can be Al, Al alloy or a multilayer structure comprising Al. The first insulating layer 230 can be $Si_3N_4$ or $SiO_2$. The semiconductor layer 240 can be amorphous silicon. The second insulating layer 250 can be $Si_3N_4$ or $SiO_2$. The sacrificial layer 260 can be Al, Mo, Cr, ITO or IZO.

Figure 3:
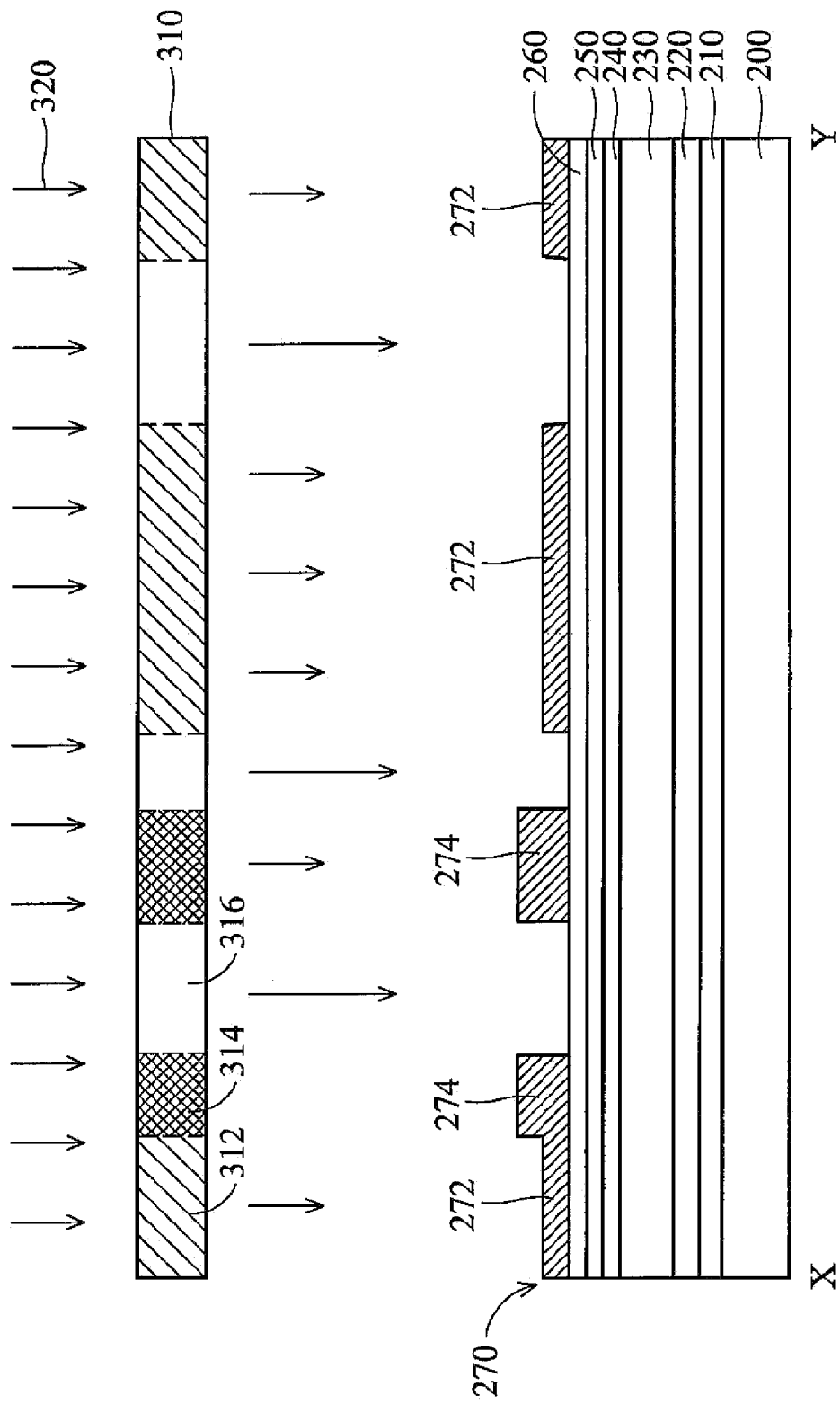

In FIG. 3, a photoresist layer (not shown, e.g. a positive photoresist layer) is thoroughly coated on the sacrificial layer 260. By performing a photolithography process 320 with a half-tone photomask 310 (referred to as the first photomask), a photoresist pattern 270 comprising a first photoresist layer 272 and a second photoresist layer 274 is formed on part of the sacrificial layer 260. The second photoresist layer 274 is thicker than the first photoresist layer 272. In this embodiment, the half-tone photomask 310 comprises three areas 312, 314 and 316 with different transmittance. For example, numeral 312 denotes a semi-transmissive area 312 corresponding to the first photoresist layer 272. Numeral 314 denotes an opaque area 314 corresponding to the second photoresist layer 274. Numeral 316 denotes the transmissive area 316 corresponding to the area without photoresist.

Figure 4:
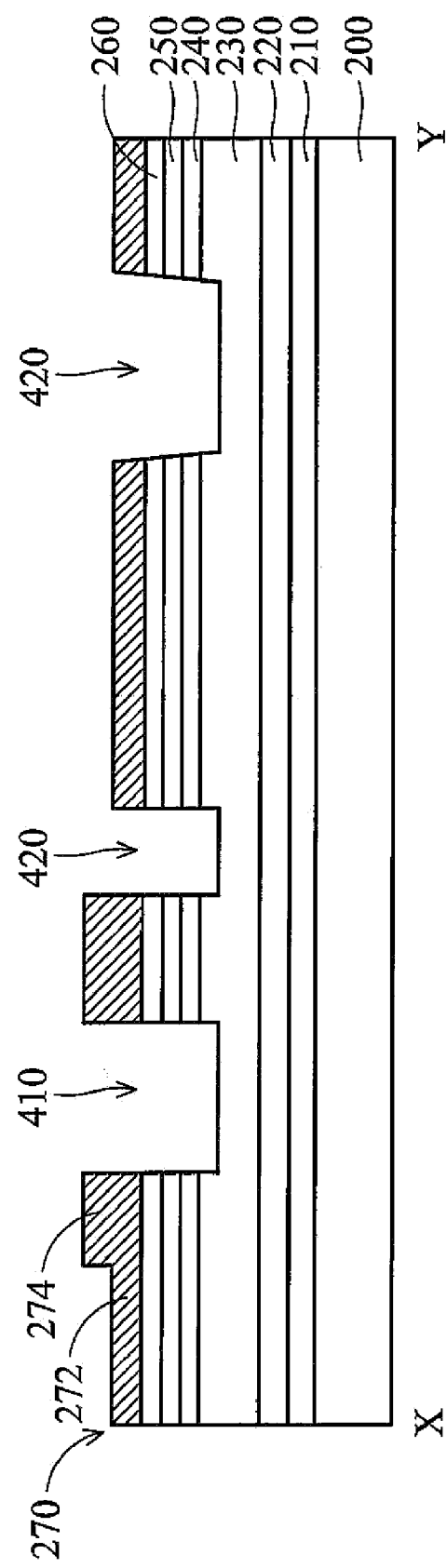

In FIG. 4, the photoresist pattern 270 serves as an etching mask. At least part of the sacrificial layer 260, the second insulating layer 250 and the semiconductor layer 240 are removed to form a first opening 410 and a second opening 420. Referring to FIG. 1, the first opening 410 corresponds to a position in the gate line 910 near the gate 912 formed in subsequent processes. The second opening 420 corresponds to the periphery of the pixel electrode 918. In some embodiments, the openings 410 and 420 can expose the first insulating layer 230 therein.

Figure 5:
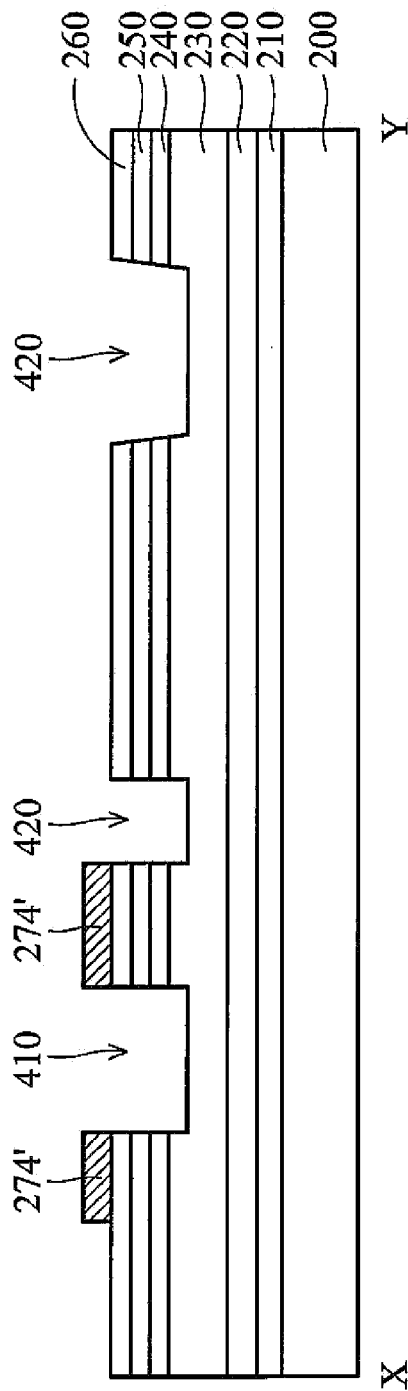

In FIG. 5, the first photoresist layer is removed by ashing, such that a remaining second photoresist layer 274' is left on part of the sacrificial layer 260.

Figure 6:
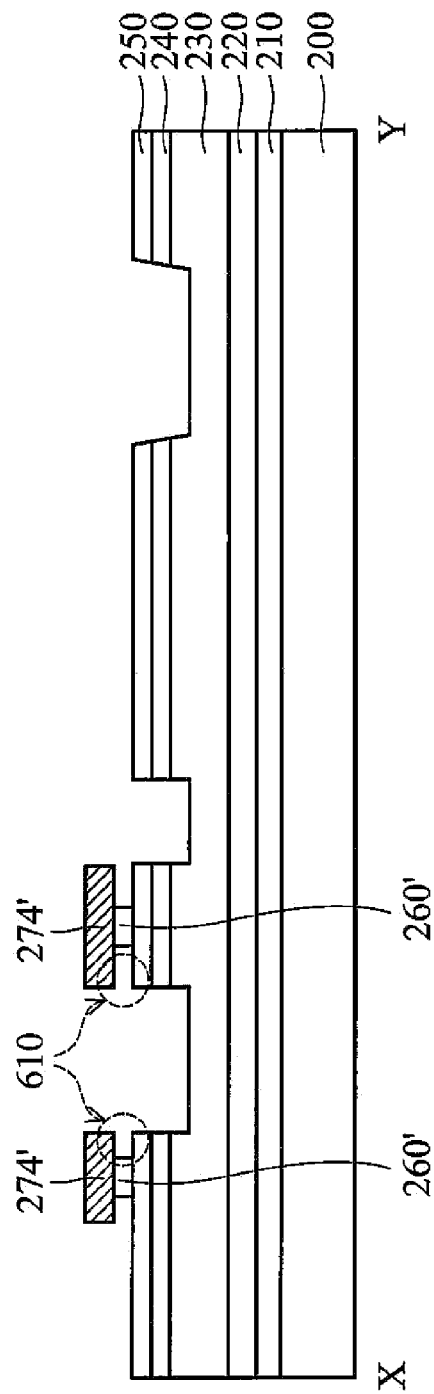

In FIG. 6, the remaining second photoresist layer 274' serves as an etching mask. By sequentially performing anisotropic etching (e.g. dry etching) and isotropic etching (wet etching), part of the sacrificial layer 260 is removed to form a remaining sacrificial layer 260' narrower than the remaining second photoresist layer 274'. This is called a side etching of the remaining sacrificial layer 260', resulting in an undercut 610 beneath the remaining second photoresist layer 274'. When the sacrificial layer 260 is Al, the isotropic etching can be a wet etching using nitric acid-containing solution. Because of the first opening 410 and second opening 420, the remaining sacrificial layer 260' is discontinuous at the periphery of the first opening 410 after the side etching.

Figure 7:
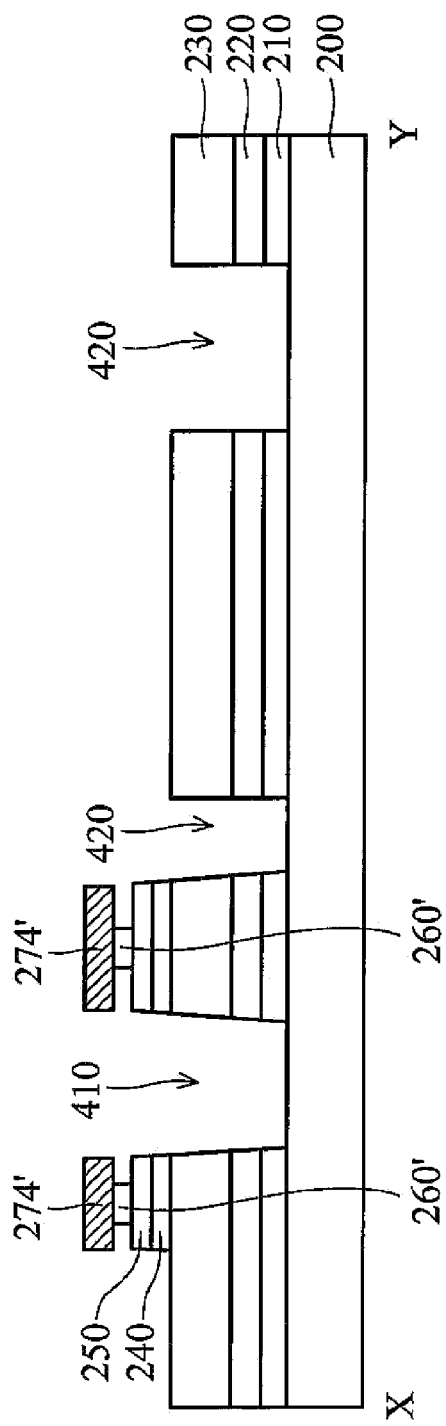
Figure 8:
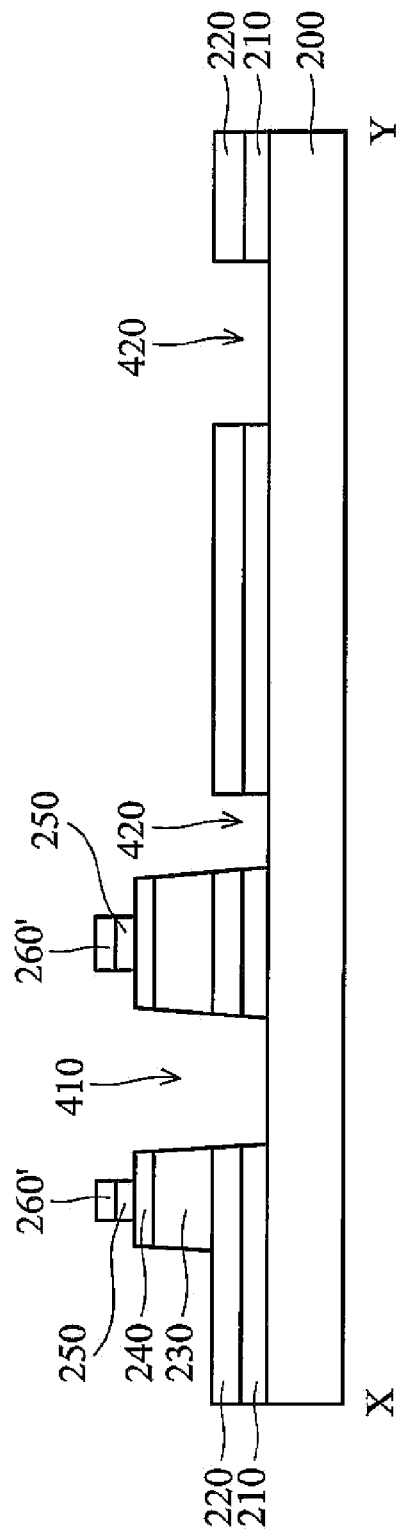

In FIG. 7, the remaining second photoresist layer 274' serves as an etching mask. By performing anisotropic etching (e.g. dry etching), the second insulating layer 250 and the semiconductor layer 240 are removed, meanwhile, the first insulating layer 230 can also be removed in the openings 410 and 420. Still using the remaining second photoresist layer 274' as an etching mask, another anisotropic etching (e.g. dry etching) is performed to remove the first metal layer 220 and the transparent conductive layer 210 in the openings 410 and 420 to expose the substrate 200.

Note that the etching sequences illustrated in the FIGS. 4-7 are variable. The following variations are provided for better understanding, but are not intended to limit the disclosure.

Figure 13A:
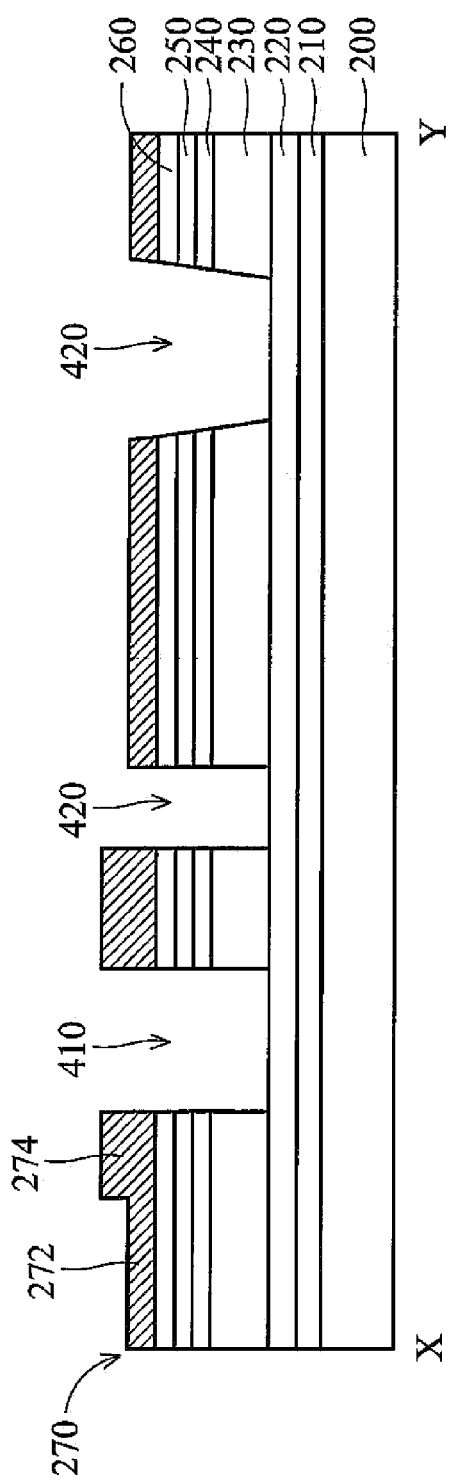
FIGS. 13A-13C are cross-sectional views illustrating a variation of an etching process of the manufacturing process.
Figure 13B:
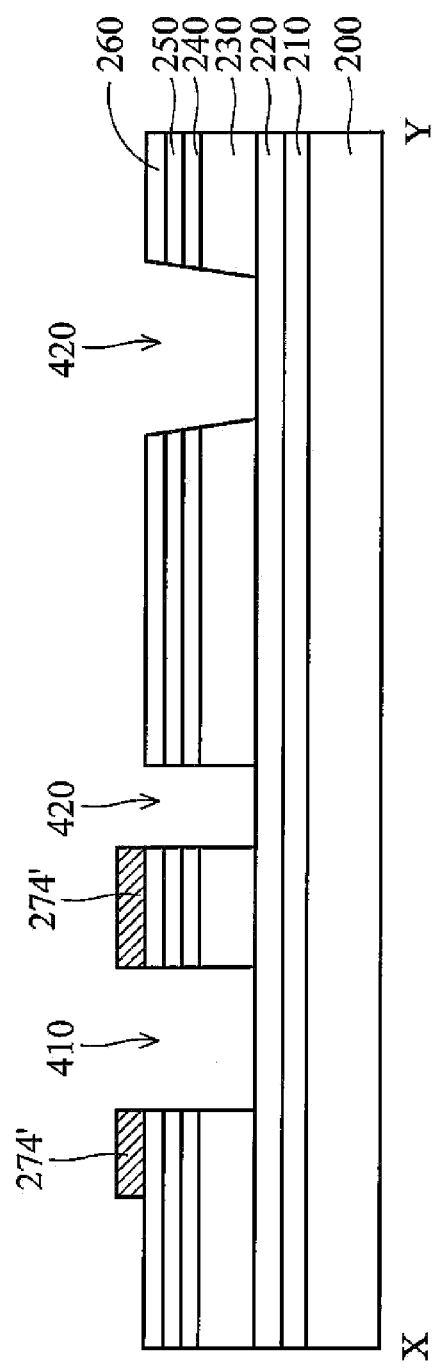
Figure 13C:
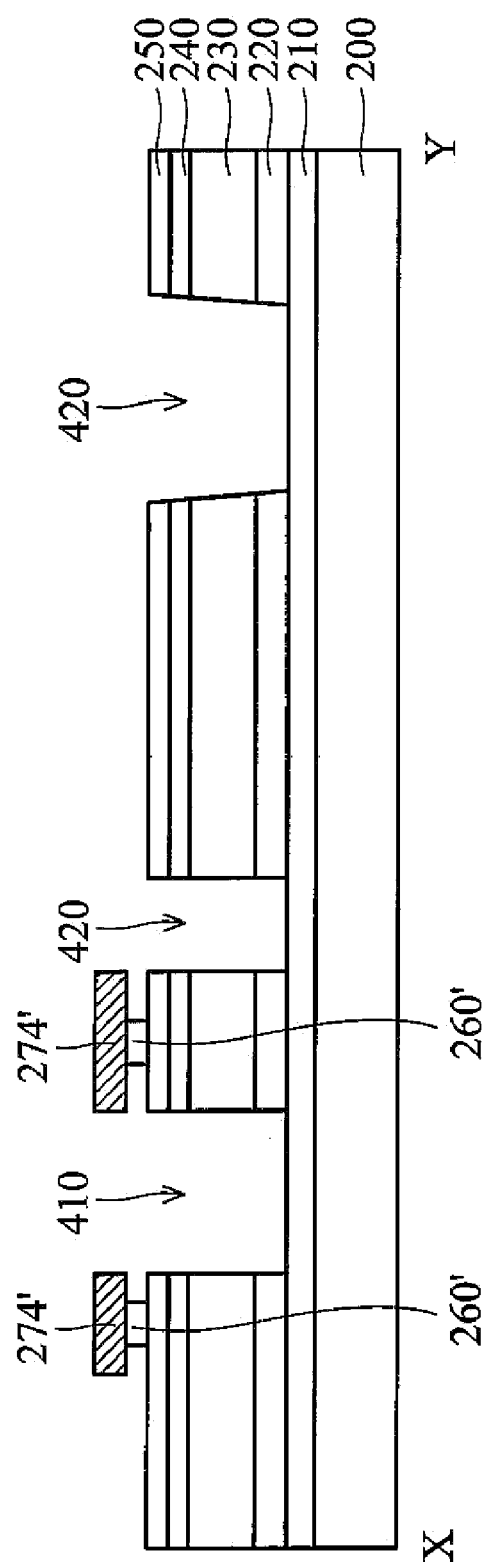

FIGS. 13A-13C are cross-sectional views illustrating a first variation of the etching sequences. In the first variation, the material of the sacrificial layer 260 and the first metal layer 220 is preferably the same, for example, Al. In FIG. 13A, part of the sacrificial layer 260, the second insulating layer 250, the semiconductor layer 240 and the first insulating layer 230 are removed to form the first opening 410 and the second opening 420 by using the photoresist pattern 270 as an etching mask. That is, the openings 410 and 420 expose the first metal layer 220 therein.

In FIG. 13B, the first photoresist layer 272 is then removed by ashing, leaving the remaining second photoresist layer 274' on part of the sacrificial layer 260.

In FIG. 13C, the remaining second photoresist layer 274' serves as an etching mask. By sequentially performing anisotropic etching (e.g. dry etching) and isotropic etching (wet etching), part of the sacrificial layer 260 is removed to form the remaining sacrificial layer 260' narrower than the remaining second photoresist layer 274'. Meanwhile, the first metal layer 220 is removed from the openings 410 and 420. By performing anisotropic etching (e.g. dry etching) using the remaining second photoresist layer 274' as an etching mask, the second insulating layer 250, the semiconductor layer 240 and the transparent conductive layer 210 in the openings 410 and 420 are then removed to expose the substrate 200. The structure shown in FIG. 7 is thus obtained.

Figure 14A:
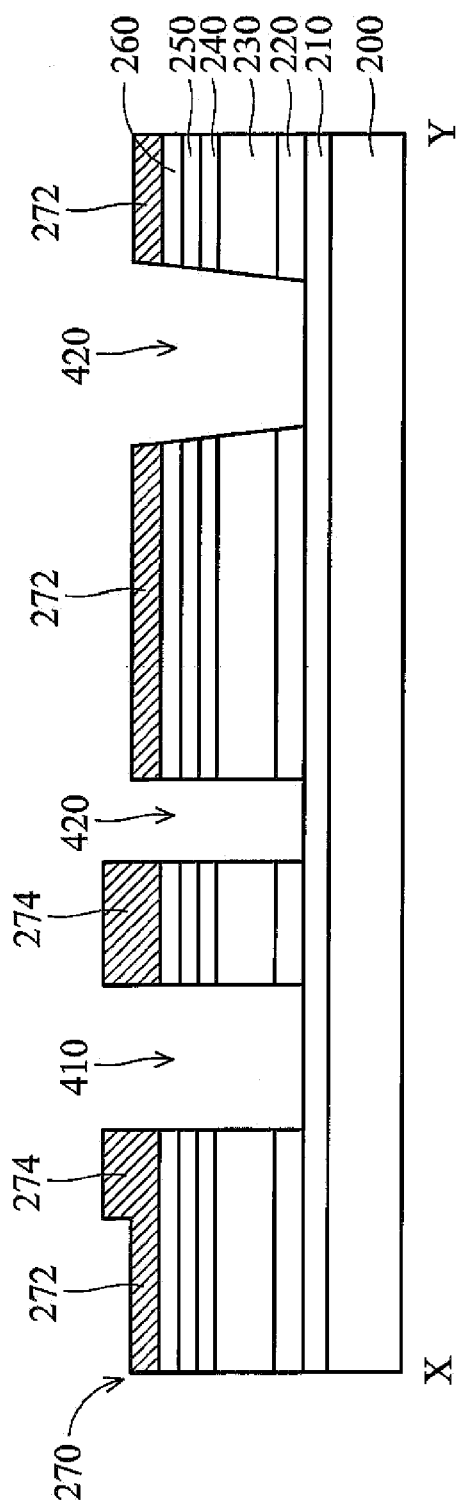
FIGS. 14A-14C are cross-sectional views illustrating another variation of the etching process of the manufacturing process.
Figure 14B:
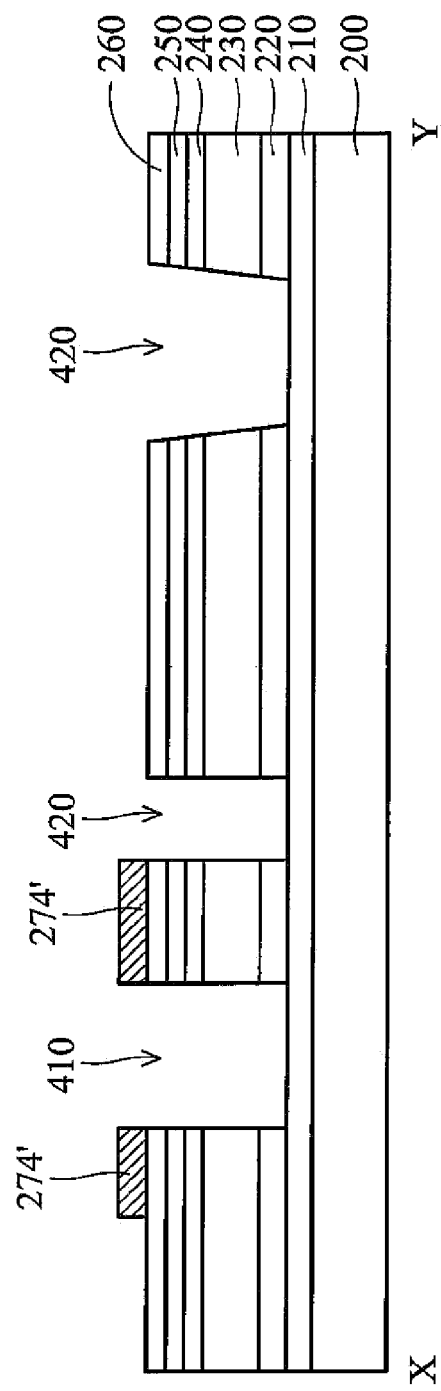
Figure 14C:
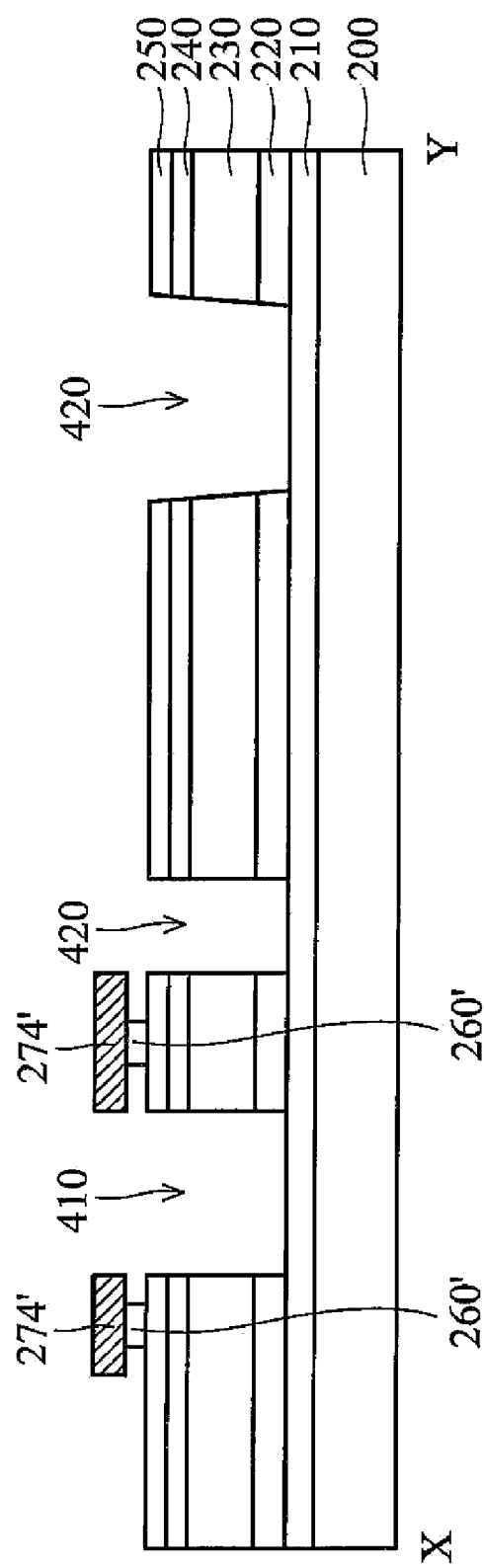

FIGS. 14A-14C are cross-sectional views illustrating a second variation of the etching sequences. In the second variation, the sacrificial layer 260 can be Al and the first metal layer 220 is preferably Al alloy or anodized Al. In FIG. 14A, part of the sacrificial layer 260, the second insulating layer 250, the semiconductor layer 240, the first insulating layer 230 and the first metal layer 220 are removed to form the first opening 410 and the second opening 420 by using the photoresist pattern 270 as an etching mask. That is, the openings 410 and 420 expose the transparent conductive layer 210 therein.

In FIG. 14B, the first photoresist layer 272 is then removed by ashing, leaving the remaining second photoresist layer 274' on part of the sacrificial layer 260.

In FIG. 14C, the remaining second photoresist layer 274' serves as an etching mask. By sequentially performing anisotropic etching (e.g. dry etching) and isotropic etching (wet etching), part of the sacrificial layer 260 is removed to form the remaining sacrificial layer 260' narrower than the remaining second photoresist layer 274'. By performing anisotropic etching (e.g. dry etching) using the remaining second photoresist layer 274' as an etching mask, the second insulating layer 250, the semiconductor layer 240 and the transparent conductive layer 210 in the openings 410 and 420 are then removed to expose the substrate 200. The structure shown in FIG. 7 is thus obtained.

Figure 15A:
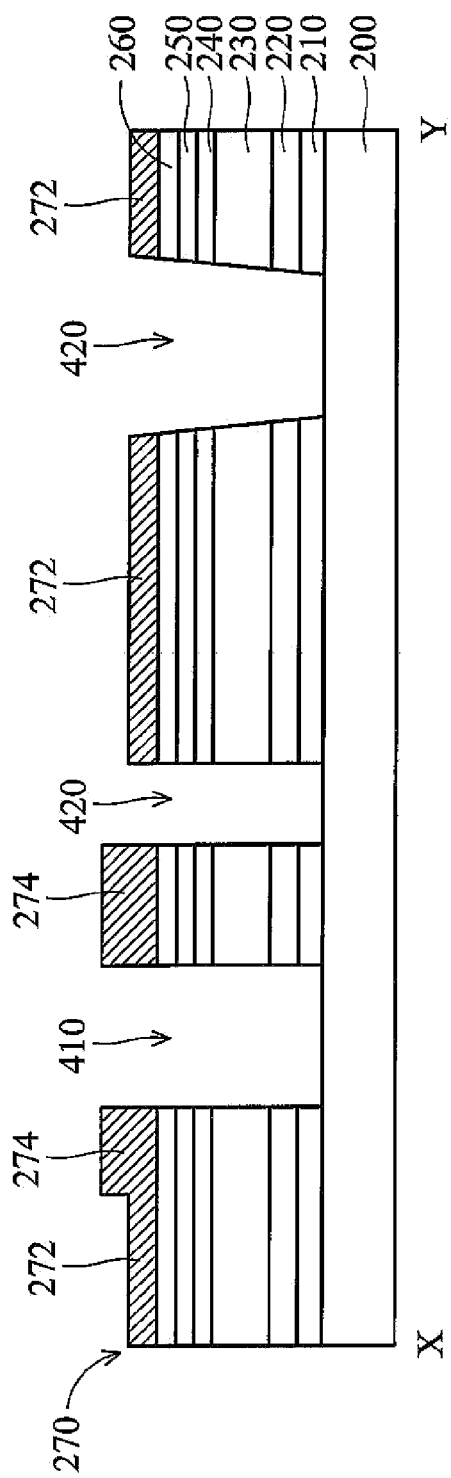
FIGS. 15A-15C are cross-sectional views illustrating another variation of the etching process of the manufacturing process.
Figure 15B:
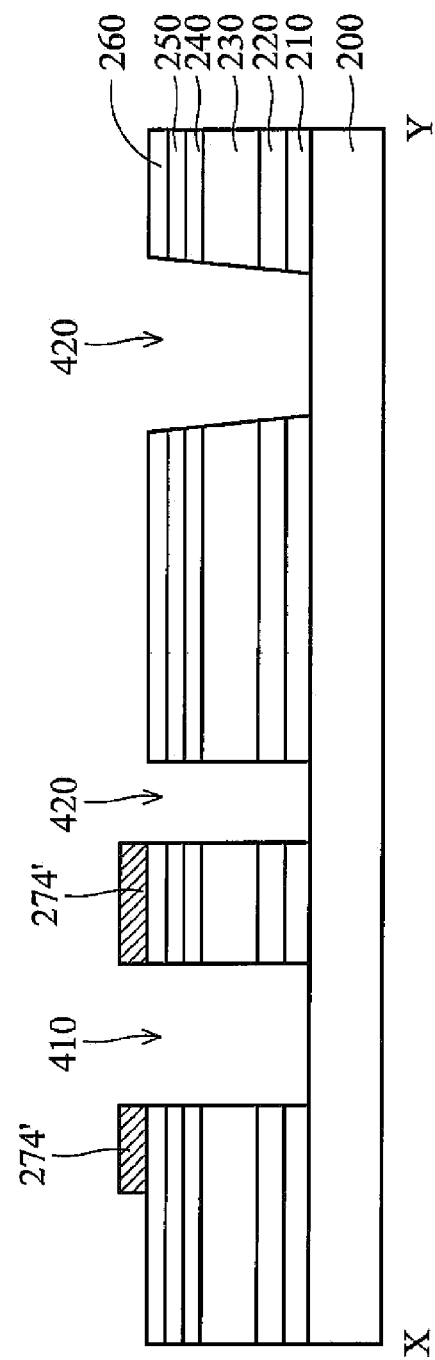
Figure 15C:
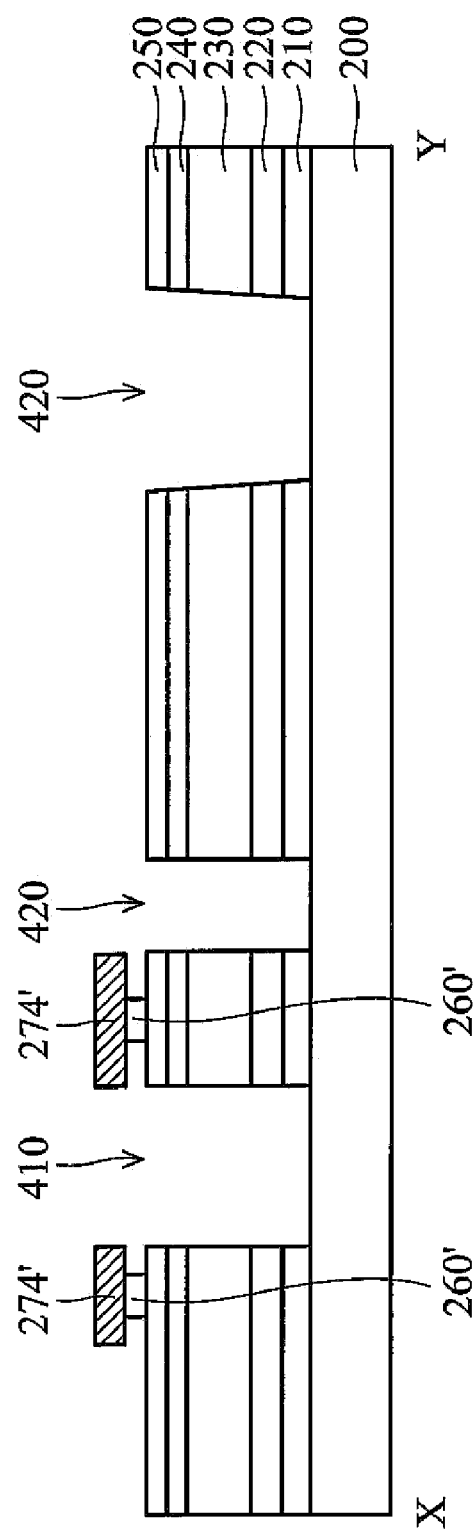

FIGS. 15A-15C are cross-sectional views illustrating a third variation of the etching sequences. In the third variation, the sacrificial layer 260 can be Al and the first metal layer 220 is preferably Al alloy or anodized Al. In FIG. 15A, part of the sacrificial layer 260, the second insulating layer 250, the semiconductor layer 240, the first insulating layer 230, the first metal layer 220 and the transparent conductive layer 210 are removed to form the first opening 410 and the second opening 420 by using the photoresist pattern 270 as an etching mask. That is, the openings 410 and 420 expose the substrate 200 therein.

In FIG. 15B, the first photoresist layer 272 is then removed by ashing, leaving the remaining second photoresist layer 274' on part of the sacrificial layer 260.

In FIG. 15C, the remaining second photoresist layer 274' serves as an etching mask. By sequentially performing anisotropic etching (e.g. dry etching) and isotropic etching (wet etching), part of the sacrificial layer 260 is removed to form the remaining sacrificial layer 260' narrower than the remaining second photoresist layer 274'. By performing anisotropic etching (e.g. dry etching) using the remaining second photoresist layer 274' as an etching mask, the second insulating layer 250 and the semiconductor layer 240 are then removed. The structure shown in FIG. 7 is thus obtained.

Returning to FIG. 8, the remaining second photoresist layer 274' is removed to expose the remaining sacrificial layer 260'. By using the remaining sacrificial layer 260' as an etching mask, part of the second insulating layer 250 and the first insulating layer 230 are removed to expose a portion of the first metal layer 220.

Figure 9:
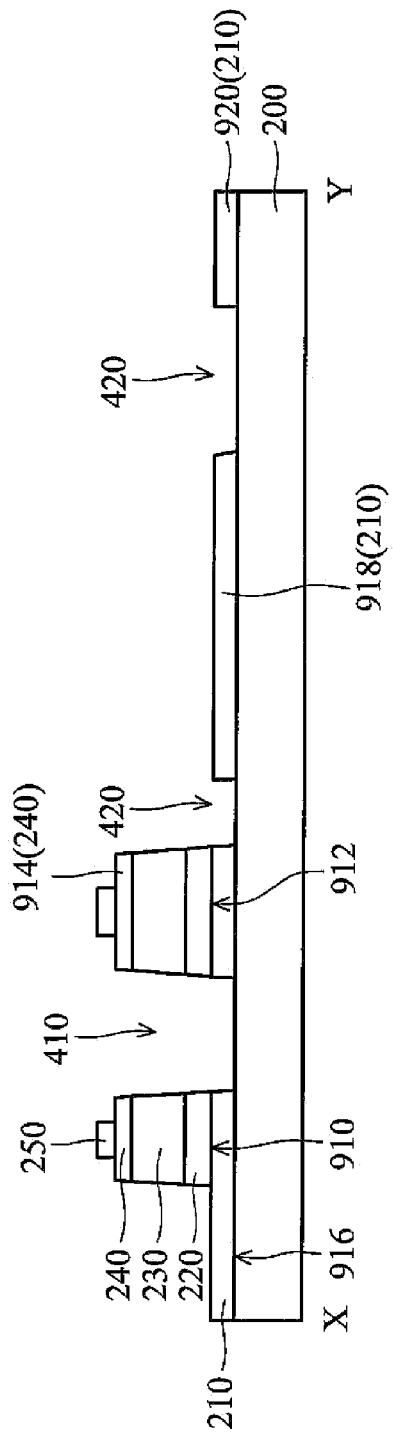

In FIG. 9, the remaining sacrificial layer 260' and the exposed first metal layer 220 are removed to define a gate line 910 comprising a gate 912, a channel layer 914 located directly above the gate 912, a gate pad 916 located at the end portion of the gate line 910, a pixel electrode 918 and a source pad 920. Referring to FIG. 1, the first opening 410 is located in the gate line 910 near the gate 912. Because of the narrower gate line 910 near the first opening 410, the semiconductor layer 240 above the gate line 910 near the first opening 410 is discontinuous after the disclosed numerous etching steps.

Figure 10:
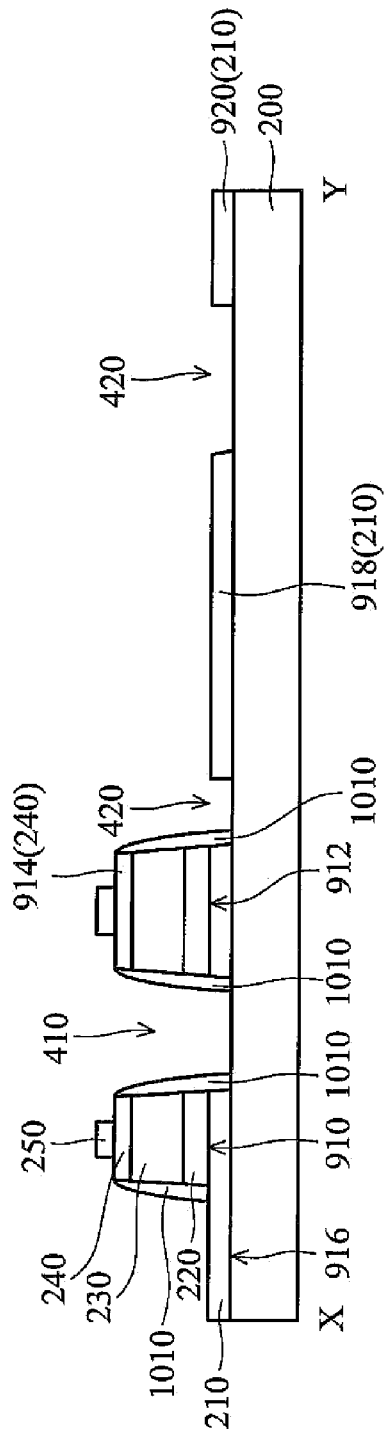

In FIG. 10, a conformal insulating layer (not shown) is formed overlying the substrate 200. By performing anisotropic etching (e.g. dry etching), an insulating spacer 1010 is formed on the sidewalls of the gate line 910, the gate 912 and the semiconductor layer 240. The insulating spacer 1010 can be $Si_3N_4$ or $SiO_2$.

Figure 11:
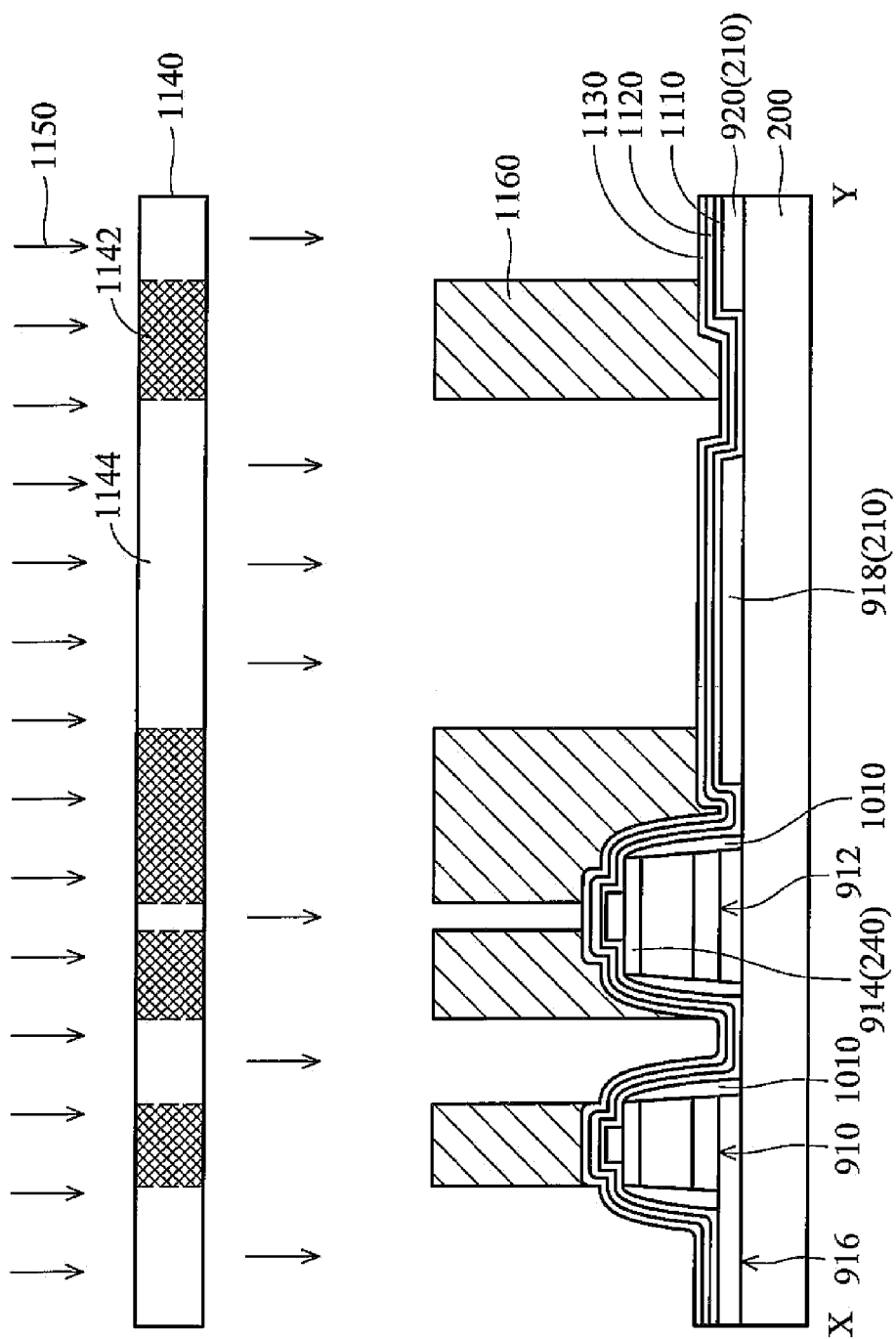

In FIG. 11, a doped semiconductor layer 1110, a second metal layer 1120 and a protection layer 1130 are sequentially formed overlying the substrate 200 by, for example, deposition. The doped semiconductor layer 1110 can be $n^+$ type ion doped silicon. The second metal layer 1120 can be Al, Al alloy or a multilayer structure comprising Al. The protection layer 1130 can be $Si_3N_4$. By performing a photolithography process 1150 with a second photomask 1140, a photoresist pattern 1160 is then formed. Numeral 1142 denotes an opaque area and numeral 1144 a transmissive area.

Figure 12:
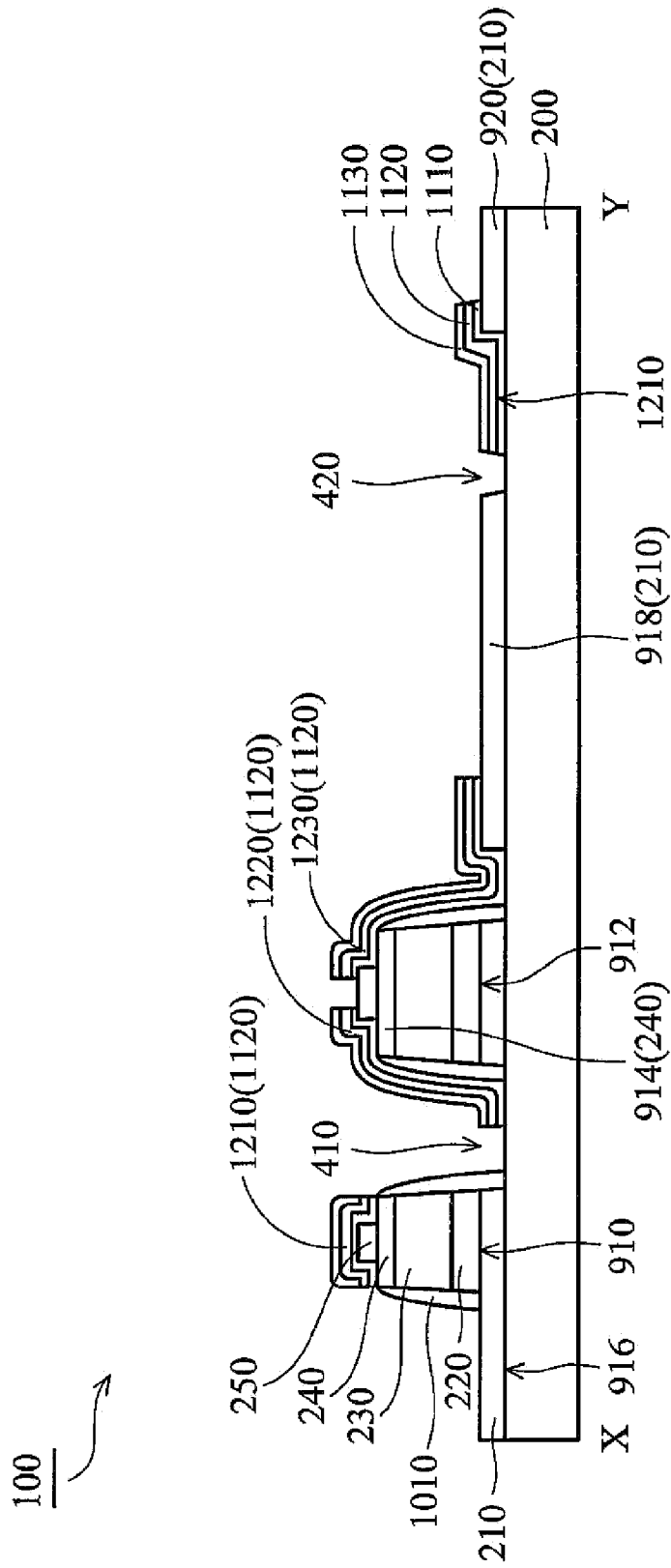

By using the photoresist pattern 1160 as an etching mask, the protection layer 1130, the second metal layer 1120 and the doped semiconductor 1110 are patterned to define a source line 1210 (or data line), a source 1220 and a drain 1230. Last, the photoresist pattern 1160 is removed, as shown as FIG. 12. Referring to FIGS. 1 and 12, the source line 1210 crosses the gate line 910. The end portion of the source line 1210 is electrically connected to the source pad 920. The source 1220 is extended from the source line 1210 and electrically connected to the channel layer 914. The drain 1230 is electrically connected to the channel layer 914 and the pixel electrode 918. Accordingly, the array substrate 100 for use in a TFT-LCD can thus be obtained with only two photomasks.

Array substrates for use in TFT-LCDs are provided. An exemplary embodiment of a TFT-LCD, shown in FIGS. 1 and 12, comprises an array substrate 100. The array substrate 100 comprises an insulating substrate 200 comprising a gate line area 910 with a gate region 912, a gate pad area 916 connected to the end portion of the gate line area 910, a source line area 1210 crossing the gate line area 910, a source pad area 920 connected to the end portion of the source line area 1210, and a pixel area 918 defined by the crossing gate and source lines 910 and 1210. A transparent conductive layer 210 is disposed overlying the substrate 200 in the gate pad area 916, the gate line area 910, the gate region 912, the source pad area 920 and the pixel area 918. A first metal layer 220 is disposed overlying the transparent conductive layer 210 in the gate line area 910 and the gate region 912. A first insulating layer 230 is disposed overlying the first metal layer 220. A semiconductor layer 240 is disposed overlying the first insulating layer 230. An insulating spacer 1010 is disposed on at least sidewalls of the first metal layer 220. A second insulating layer 250 is disposed overlying part of the semiconductor layer 240. A second metal layer 1120 is formed above the insulating substrate 200 in the source line area 1210, overlying part of the semiconductor layer 240 in the gate region 912 and part of the transparent conductive layer 210 in the pixel area 918. Note that the second metal layer 1120 in the source line area 1210 serves as a source line 1210, the second metal layer 1120 on part of the semiconductor layer 240 in the gate region 912 serves as a source 1220 and a drain 1230, the source 1220 is electrically connected to the source line 1210 and the drain 1230 is electrically connected to the transparent conductive layer 210 in the pixel area 918.

While the invention has been described by way of example and in terms of the preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An array substrate for use in a thin film transistor liquid crystal display, comprising:

a substrate comprising a gate line area with a gate region, a gate pad area connected to an end portion of the gate line area, a source line area crossing the gate line area, a source pad area connected to an end portion of the source line area, and a pixel area defined by the crossing gate and source lines;

a transparent conductive layer formed on the substrate in the gate pad area, the gate line area, the gate region, the source pad area and the pixel area;

a first metal layer formed on the transparent conductive layer in the gate line area and the gate region;

a first insulating layer formed on the first metal layer;

a semiconductor layer formed on the first insulating layer;

an insulating spacer formed on at least sidewalls of the first metal layer;

a second insulating layer formed on part of the semiconductor layer; and a second metal layer formed above the substrate in the source line area, on part of the semiconductor layer in the gate region and part of the transparent conductive layer in the pixel area.

2. The array substrate according to claim 1, wherein the second metal layer in the source line area serves as a source line, the second metal layer on part of the semiconductor layer in the gate region serves as a source and a drain, the source is electrically connected to the source line and the drain is electrically connected to the transparent conductive layer in the pixel area.

3. The array substrate according to claim 1, wherein the transparent conductive layer is an indium-tin-oxide (ITO) or indium-zinc-oxide (IZO) layer.

4. The array substrate according to claim 1, wherein each of the first metal layer and the second metal layer comprises Al.

5. The array substrate according to claim 1, wherein each of the first insulating layer and the second insulating layer comprises $Si_3N_4$ or $SiO_2$.

6. The array substrate according to claim 1, wherein the semiconductor layer comprises amorphous silicon.

7. The array substrate according to claim 1, wherein the insulating spacer comprises $Si_3N_4$ or $SiO_2$.

8. The array substrate according to claim 1, further comprising:

a doped semiconductor layer formed between the semiconductor layer and the second metal layer; and a protection layer formed on the second metal layer.

* * * * *